United States Patent
Renaud-Byrne et al.

(10) Patent No.: US 11,870,288 B1
(45) Date of Patent: Jan. 9, 2024

(54) INTELLIGENT BATTERY SYSTEM AND METHOD OF OPERATION

(71) Applicants: Francois Renaud-Byrne, Etobicoke (CA); Michael Pinosa, Mississauga (CA); Xiongyi Cui, Etobicoke (CA)

(72) Inventors: Francois Renaud-Byrne, Etobicoke (CA); Michael Pinosa, Mississauga (CA); Xiongyi Cui, Etobicoke (CA)

(*) Notice: Subject to any disclaimer, the term of this patent is extended or adjusted under 35 U.S.C. 154(b) by 0 days.

(21) Appl. No.: 17/325,047

(22) Filed: May 19, 2021

(51) Int. Cl.
 *H02J 7/00* (2006.01)
 *G01R 31/382* (2019.01)
 *G01R 31/396* (2019.01)
 *H01M 10/42* (2006.01)

(52) U.S. Cl.
 CPC .......... *H02J 7/0048* (2020.01); *G01R 31/382* (2019.01); *G01R 31/396* (2019.01); *H01M 10/425* (2013.01); *H02J 7/007194* (2020.01); *H01M 2010/4271* (2013.01)

(58) Field of Classification Search
 None
 See application file for complete search history.

(56) References Cited

U.S. PATENT DOCUMENTS

| | | | |
|---|---|---|---|
| 5,600,230 A * | 2/1997 | Dunstan | H02J 7/00036 324/427 |
| 5,606,242 A | 2/1997 | Hull | |
| 6,864,666 B2 | 3/2005 | Breen | |
| 7,041,400 B2 | 5/2006 | Kim | |
| 7,683,576 B2 | 3/2010 | Tien | |
| 8,912,756 B2 | 12/2014 | Emori | |
| 9,525,301 B2 | 3/2016 | White | |
| 9,620,987 B2 | 4/2017 | Alexander | |
| 9,847,654 B2 | 12/2017 | Beaston | |
| 9,849,803 B2 | 12/2017 | Morioka | |
| 9,853,462 B2 | 12/2017 | Zhu | |
| 10,158,152 B2 | 12/2018 | Watson | |
| 10,431,996 B2 | 10/2019 | Liu | |
| 10,587,019 B2 | 3/2020 | Wayne | |
| 10,651,660 B2 | 5/2020 | Ganor | |
| 10,661,663 B2 | 5/2020 | Zhang | |
| 10,753,761 B2 | 8/2020 | Ricci | |
| 2017/0040646 A1 * | 2/2017 | Beaston | G06F 11/0736 |
| 2018/0134171 A1 | 5/2018 | Hyde | |
| 2018/0145519 A1 | 5/2018 | Trigiani | |

FOREIGN PATENT DOCUMENTS

| | | |
|---|---|---|
| CN | 104081622 B | 10/2014 |
| CN | 102655346 B | 4/2016 |
| CN | 106740132 B | 5/2017 |
| CN | 111668565 A | 9/2020 |
| JP | 6147668 B2 | 11/2013 |
| WO | 2013047994 A2 | 4/2013 |

* cited by examiner

*Primary Examiner* — Roy Y Yi (57) ABSTRACT

Provided is a battery system, including: at least two batteries, each battery comprising a battery management system; a plurality of sensors for sensing battery operation data; at least one external connection port; wherein: at least two battery management systems of the at least two batteries are coupled to the at least one external connection port; and at least two battery management systems of the at least two batteries store machine-executable instructions, that when executed, cause the at least one battery management system to communicate battery operation data to at least one external load.

19 Claims, 5 Drawing Sheets

INTELLIGENT BATTERY SYSTEM AND METHOD OF OPERATION

FIELD OF THE DISCLOSURE

The disclosure generally relates to batteries, and in particular, to an intelligent multi-battery system and a method of operation therefore.

BACKGROUND

Battery systems including one or more batteries, each battery comprising a number of battery cells, and a battery management system (BMS) are known in the art. Battery systems typically include a BMS to manage their operation by, for example, monitoring the state of batteries. Battery systems are also known in the art to include communication data ports for enabling communication between the BMS and components of the battery system.

One prior art teaches a BMS that manages the power supply to external loads. A battery system includes one or more loads (i.e., devices) that communicates with the BMS via a bus. A power source is coupled to a load via a voltage regulator and the voltage regulator adjusts an input voltage level to the load based on information received from the load. Information about the load (e.g., a power rating) is received by a voltage regulation controller at start up and updated at any point. Independently, an input voltage is also received by the voltage regulator. The output load current is then determined by the BMS based on the load information and the input voltage. In other art, a BMS of a battery system uses a hierarchy to disconnect electrical loads from the battery system. An input signal representing a condition of one of the components of the battery system or the electrical load (e.g., the condition or state of the battery system, the electrical load, the temperature of the battery system, etc.) is received by the BMS via a controller area network (CAN), such as a CAN bus. The input signal is compared to at least one parameter to determine whether the condition indicates that at least one of the plurality of electrical loads should be disconnected from the battery. The BMS then directs an associated switch to be opened or closed or provide information about the condition of the battery system for display to a user, for use by another system, etc. In the case of multi-battery systems including two or more batteries, the BMS has been proposed to coordinate operation of all batteries and balance the state of charge (SoC) of the batteries and charging/discharging to prevent damage to the overall system. However, further improvements to battery systems are still required to improve their overall functionality and efficiency.

SUMMARY

Provided is a battery system, including: at least two batteries, each battery comprising a battery management system; a plurality of sensors for sensing battery operation data; at least one external connection port; wherein: at least two battery management systems of the at least two batteries are coupled to the at least one external connection port; and at least two battery management systems of the at least two batteries store machine-executable instructions, that when executed, cause the at least one battery management system to communicate battery operation data to at least one external load.

Some aspects include a method of operating a battery system, including: determining, by at least one battery management system of a plurality of battery management systems each corresponding to a respective battery of the battery system, a master battery management system of the plurality of battery management systems; transmitting, by the master battery management system, battery operation data to an external load connected to an external connection port of the battery system over power lines via a CANBUS; and determining, by the master battery management system, when a new battery is integrated with the battery system based on at least state of charge of the batteries of the battery system wherein: the external connection port is configured to transmit power from the battery system to the external load and power from an external charger to the battery; all battery management systems except the master battery management system are designated as slaves; the master battery management system controls overall operations of the battery system; and the master battery management system communicates with the remaining battery management systems over power lines via CANBUS.

BRIEF DESCRIPTION OF THE DRAWINGS

For a better understanding of the various embodiments described herein and to show more clearly how they may be carried into effect, reference will now be made, by way of example only, to the accompanying drawings

DETAILED DESCRIPTION OF SOME EMBODIMENTS

For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description.

Some embodiments include a battery system including one or more batteries and a BMS for managing operation thereof. In embodiments, the battery system provides a number of features that collectively work to preserve the health of the one or more batteries, as well as one or more connected external loads or external chargers. A variety of conditions are monitored by the BMS to make intelligent decisions, such as when to shut off or interrupt power flow to the one or more batteries either collectively or individually. In addition, an external load may control the power being supplied by the battery system. Further, the BMS may communicate battery operation data to the external load and receive external load data from the external load. The external load data may be used alone or in combination with the battery operation data collected by sensors of the battery system in making intelligent operation decisions. By using the battery operation data provided by various sensors and the external load data, the BMS may efficiently and safely manage the health of the one or more batteries. For instance, any conditions outside of safe operating ranges defined via customizable parameters result in a shut off of the power circuit of the battery system, disconnection of a particular battery of the system, or a change in performance characteristics until conditions return to within the safe operating ranges.

In some embodiments, the battery system may include one or more rechargeable batteries and various components for managing the charging of the batteries when connected to an external charger, and their discharging to an external load to which the batteries may be coupled to provide power thereto. Exemplary external loads may include, pneumatic compressors, lighting equipment, power tools, audio systems for music events, hydraulic pumps, electric motors, and variable frequency drives. In combination with an inverter, the battery will be able to power everyday electronics, from lights, laptops and up to ovens and washing machines.

In embodiments, battery operation data may be collected and used by the BMS of the battery system to manage operation of the one or more batteries, including controlling a smart external charger connected to the battery system. In addition, some or all of the battery operation data may be communicated to an external load such that the external load may direct the battery system on how to operate via battery operation commands. For example, a battery operation command load may, depending on the battery operation data, direct the battery system to reduce the provided voltage, amperage, power or activate support components such as heaters and cooling units, or activate visual warnings.

Figure 1A:
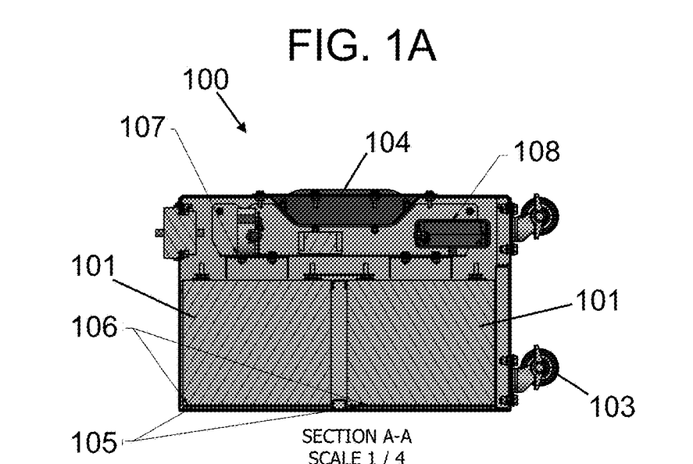
FIGS. 1A-1D illustrate an example of a battery system, according to some embodiments.
Figure 1B:
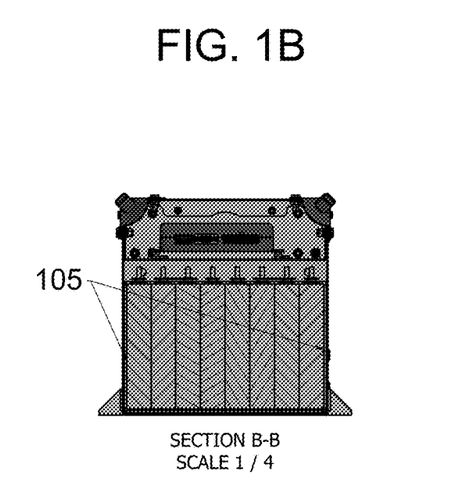
Figure 1C:
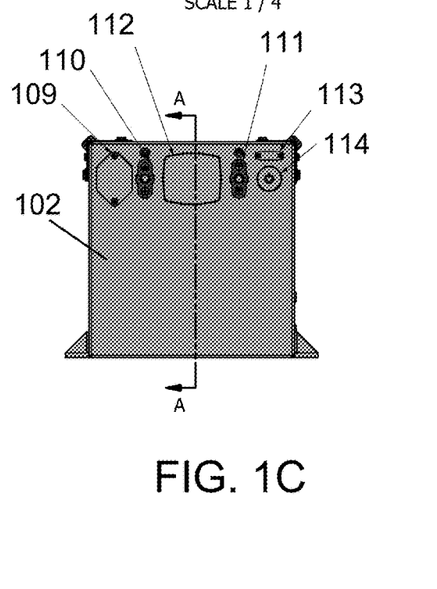
Figure 1D:
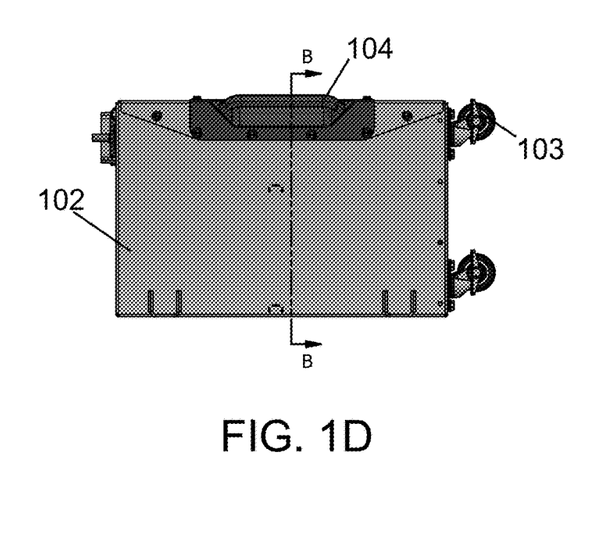
Figure 1E:
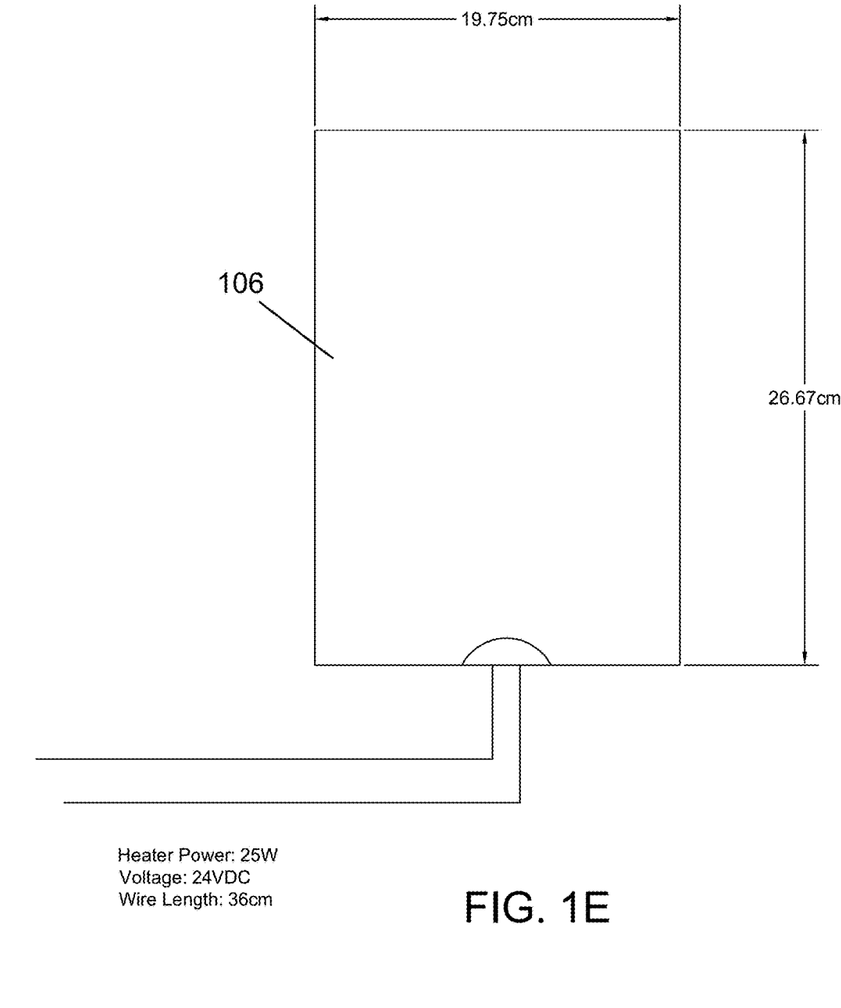
FIG. 1E illustrates an example of a heating blanket, according to some embodiments.

In some embodiments, the battery system may include two or more batteries to increase power output capacity. FIGS. 1A-1D illustrate multiple views of an example of a battery system 100 including one battery 101 housed in a cuboid, ruggedized shell 102 with a detachable lid. Each battery 101 comprises of 16 cells (e.g., 125 Ah Lithium Iron Phosphate cells) for power storage and power generation purposes. A castor wheel 103 is positioned at each corner of a bottom surface of the shell 102 while lifting handles 104 are coupled to a side surface of the shell 102 for ease of transport. The battery system 100 further includes insulation 105, heating blankets 106, and an electronics subassembly 107 including a BMS 108 for each battery 101. The insulation 105 surrounds the batteries 101 to improve the efficiency of a heating system while the heating blankets 106 are positioned at a base of the batteries 101 to provide heat during cold conditions. The subassembly 107 may further include sensors for monitoring and controlling the state of the batteries 101 and communication with systems external to the battery system 100. A breaker 109, a positive terminal 110 and a negative terminal 111, a LCD display 112, a communications port 113, and a power button 114 are disposed on the shell 102. While only one battery 101 is shown in this example, the battery system may comprise any number of batteries (e.g., 1, 10, or 20 batteries). FIG. 1E illustrates an example of the heating blanket 106. In some embodiments, the battery system 100 includes a CANBUS controlled monochrome display for outputting operational data and battery status.

Figure 2:
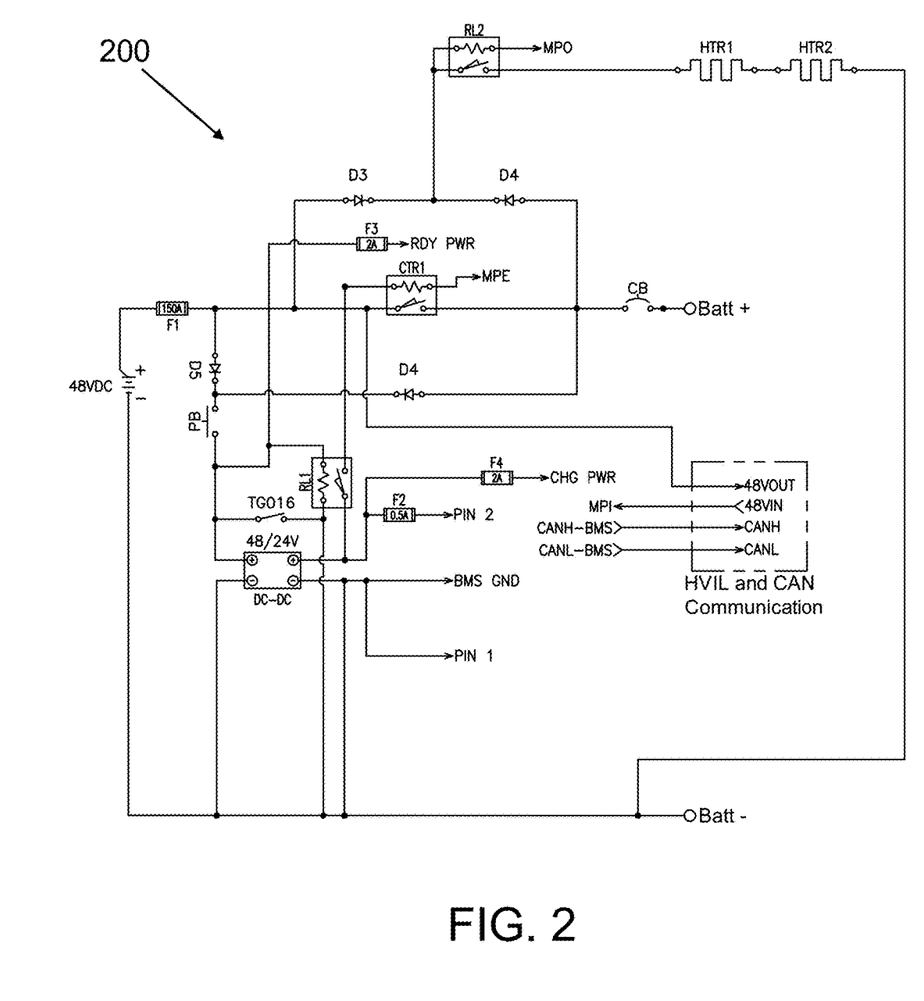
FIG. 2 is a schematic diagram of various components of a battery system, according to some embodiments.

FIG. 2 illustrates an example of a battery system control circuit 200. The battery system control circuit 200 is monitored and controlled by a BMS. The main output of the battery system is controlled via a contactor CTR1. The contactor CTR1 turns on upon the power button PB turning on and supplies power to the direct current-to-direct current converter DC/DC. If all safety criteria (i.e. temperature, cell voltage, no shortage, etc.) are met, based on sensor data (e.g. battery voltage, temperature, internal resistance etc.) received by the BMS, then the BMS closes the contactor CTR1, thereby allowing the battery system to output power. If at any point during operation the BMS detects an issue based on the sensor data, the BMS opens the contactor CTR1 to terminate power. The BMS also controls the heating blankets denoted as HTR1 and HTR2, via a relay RL2. When a battery temperature drops below a minimum temperature requirement, the BMS closes the relay RL2 to provide power to the heating blankets HTR1 and HTR2. As one or more batteries heat up, the BMS monitors temperatures. When battery temperatures surpass the minimum temperature requirement by a few degrees Celsius, the BMS opens the relay RL2 to disconnect the heating blankets HTR1 and HTR2 from power. The high voltage interlock (HVIL) circuit creates a continuous electrical path between components of the battery system (e.g., maximum power point tracker, inverter, etc.) via voltage out 48V OUT and voltage in 48VIN ports. If there is a break in the HVIL circuit (e.g., due to a disconnection or a broken component), the BMS pin MPI no longer receives a 48V signal. The BMS may detect something is wrong when the MPI pin does not receive power and may consequently disconnect the battery system from the load. The HVIL circuit allows the battery to disconnect via a manual switch from the load at the same time. In embodiments, the batteries of the battery system communicate with each other and any external device such as an inverter/charger via the CAN communication pins CANH and CANL.

In embodiments, a battery of the battery system is comprised of a set of battery cells, each of which is connected in series on a cell level. The positive terminal of a first battery cell is coupled to the negative terminal of a second battery cell via a first interconnect. In turn, the positive terminal of the second battery cell pair is coupled to the negative terminal of a third battery cell pair via a second interconnect. The other battery cells are all connected in series via interconnects in a similar manner. The battery cells are positioned in a 16-in-series configuration. It will be understood that the configuration may be varied. For example, battery cells may be arranged 16-in-series and 2-in-parallel or 8-in-series and 2-in-parallel, or some other different configuration to achieve different voltages and energy capacities. By coupling the battery cells together, the battery cells effectively form a single battery. The battery cells are grouped into two cell groups. The negative terminal of the battery (that is, the negative terminal of the first battery cell pair in the battery) is coupled to a current shunt that, in turn, is coupled to a negative lead extending to the negative power connectors and of an external connection port, such as the external connection ports of the battery system in FIGS. 1A-1D. Other means for measuring amperage draw or acceptance include a Hall effect sensor.

A positive lead of the battery extends between the positive terminal of the last battery cell and the positive power connectors and of the external connection port. A fuse along the positive lead is configured to break the power circuit in the case where the current exceeds a predetermined threshold of, for example, 400 amperes. The fuse amperage threshold may be varied as needed. In addition, a main contactor may be conditioned to break and close the power circuit via the positive lead. In order to determine the potential difference for each battery cell, a set of voltage taps are connected to various terminals of the battery cells and extend to a BMS, enabling the BMS to determine the potential difference for each battery cell by comparing the voltage across sequentially adjacent voltage taps.

In some embodiments, the BMS is coupled to the current shunt of the battery to receive amperage data from the battery. The BMS may manage the operation of the battery system, including the charging and discharging of one or more batteries of the battery system. In order to do so, the BMS stores machine-executable instructions that, when executed by the BMS, cause the BMS to monitor a variety of conditions, such as the operational temperature, load sensors, etc., and use a programmed custom set of parameters to determine if it is safe for the overall battery system and individual batteries to operate and to what degree of operational performance. The machine-executable instructions may be implemented in software, firmware, an application-specific integrated circuit, etc. The conditions monitored are referred to as battery operation data, and include battery condition data. Battery condition data may include, for example, temperature (for example, for each battery cell, between the battery cells, for each individual battery, the battery system as a whole, and/or of the BMS unit that measures the BMS internal board temperature), voltage across each entire battery, voltage across each battery cell, amperage draw during discharge, amperage accepted during charge, maximum battery voltage of each battery, and the internal resistance of each battery cell. Other battery operation data may include elevation, humidity, error notification, charge/discharge mode, faults list, ground fault protection, and outside temperature. In some embodiments, various sensors may be employed in the battery system to capture the battery operation data, including but not limited to thermal sensors, altimeters, voltage taps, and current shunts. External load data received from an external load via the external connection port may also be used by the BMS to base its operating decisions on both internal logic as well as external logic from connected equipment. During this process, the BMS may calculate secondary data. Secondary data may include, for example, predicted operation time until empty, estimated life cycles to be achieved, heat build-up during operation, time to full charge, and time until battery system achieves optimum charging or discharge temperature.

In embodiments, the BMS may have two data communication leads extending to the external connection port, a CAN-Low lead coupled to the CAN-Low connector and a CAN-High lead coupled to the CAN-High connector. The potential difference across the CAN-Low lead and the CAN-High lead is used to convey data. The CAN-Low lead and the CAN-High lead enable the BMS to send battery operation data to and receive external load data from the external load. A set of three thermal sensors extending from the BMS are positioned adjacent the battery cells and provide thermal data to the BMS. Any number of thermal sensors may be employed, depending on the application.

In embodiments, the BMS continually collects battery operation data during operation. The battery operation data collected includes thermal data from the thermal sensors, battery cell voltage data from the voltage taps, SoC of the battery, cycle counts, internal resistance of each battery cell, historic faults, state of each output, input, contactor position, CAN messages, operating time, and the maximum and minimum values for various of these data. In some embodiments, the battery system includes user field programmable options and parameter modification.

Figure 3:
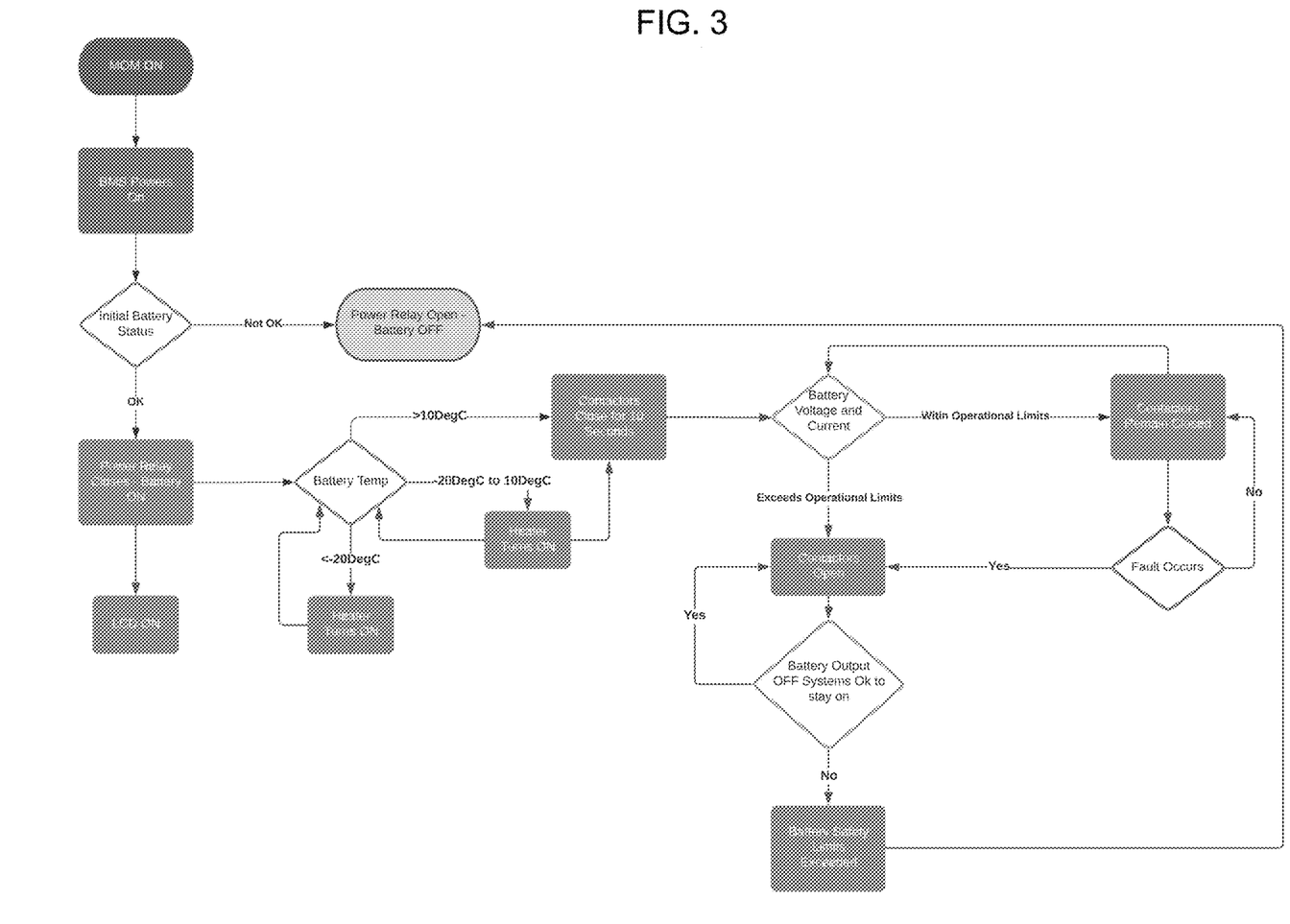
FIG. 3 illustrates an example of an operational flow chart of a battery, according to some embodiments.

FIG. 3 illustrates an example of an operational flowchart of a battery. The battery is turned on using the momentary (MOM) on switch. The momentary function closes the power relay which causes the BMS to turn on. The BMS then checks for initial battery status (i.e., battery temperature, cell voltage, no short, etc.). If the BMS determines that system functions are adequate, the LCD display turns on. If the BMS determines that the system functions are inadequate, the power relay opens thereby causing the battery to turn off. When the battery is on, the BMS constantly monitors battery temperature via thermistors mounted onto battery terminals. If the measured temperature is below −20 degrees Celsius, the BMS causes the heating blanket to turn on to warm up the battery while contactors that allow for power input and output stay open. This continues until the temperature is −20 degrees Celsius or greater. If the measured temperature is between −20 degrees Celsius and 10 degrees Celsius, then the BMS causes the heating blanket to turn on, however, the contactors that allow for power input and output close. When the measured battery temperature is greater than 10 degrees Celsius, the contactors close and the BMS checks the battery voltage and, if any, input/output current. If the voltage and current are within predetermined operational limits, the contactors remain closed and the battery remains operational. If either the voltage or current do not fall within the operational limits, then the contactors open and the battery becomes inoperable while the BMS remains operational. The BMS then continues to monitor the battery voltage safety limits and if the measured voltage falls outside the operational limits then the power relay remains open. This disconnects all electronic components in the battery to prevent further discharge of the battery.

In some embodiments, the BMS determines and transmits charge instructions to an external charger. The BMS analyzes the collected battery operation data and uses a set of battery operation parameters to determine how the external charger should operate. In particular, the battery operation parameters enable the BMS to determine, based on the SoC and the temperature of the battery, and the amperage being accepted by the battery, a prescribed voltage and amperage that should be employed to charge the battery. For example, as the SoC of the battery approaches its maximum, the prescribed voltage remains fairly constant while the prescribed amperage decreases. If the temperature of the battery increases, the prescribed amperage is dropped further. The BMS determines the voltage and amperage to be provided by the external charger, and communicates them as charge instructions to the external charger. At any time, the BMS may detect that the external charger is disconnected from the battery system. The BMS detects that the external charger is disconnected by detecting that the charger detection connector coupled to the ground detection line is no longer connected to a ground. Upon detecting that the external charger is disconnected, the BMS recommences detecting whether an external charger is connected.

In some embodiments, the BMS detects that the battery system is connected to an external load. Upon detecting that the battery system is connected to an external load, the BMS transmits battery operation data to the external load. In particular, the battery operation data transmitted by the BMS via the external connection port includes, amongst other items, the following: the number of battery cells, the voltage across the entire battery, the lowest, highest, and average voltage and resistance across each battery cell, the amperage draw during discharging, the thermal data captured via the thermal sensors, the estimated remaining battery operation time based on current usage, and the cooling fan speed. The battery operation data provided to an external load may be customized for the particular external load or may include all of the battery operation data that is shared by the battery system. The external load may need to parse the battery operation data to retrieve particular data items in which it is interested. Upon receiving the battery operation data from the battery system, the external load may present some or all of the battery operation data to a user, such as via a display panel, one or more LEDs, a speaker, an application of a communication device (e.g., smart phone, tablet, laptop, etc.) paired with the battery system, etc. The external load may modify its own behavior and operation in view of this data.

In some embodiments, external load data is received from the external load and acted upon by the BMS. The external load may communicate data about its operation to the battery system continuously or in response to battery operation data received from the battery system. In addition, the external load may trigger a decision to limit or shut off power, amperage, voltage, etc. as a result of any faults, a low state-of-charge, high or low temperatures, as well as any parameters approaching or falling outside of acceptable operating limits. The parameters may be provided by both the BMS and the external load to make a decision either at the external load or at the battery system, whichever is determined to be appropriate. The external load may affect the limiting or shutting off of power by communicating this information to the battery system as external load data via CAN communications using the CAN-High connector and the CAN-Low connector.

Alternatively, the external load may shut off power provided by the battery system by opening the control circuit through a signal output connector and a signal input connector, thereby directly opening the main contactor of the power circuit of the battery system. Upon receiving the external load data via an external connection port, the BMS may modify its behavior in view of the external load data. In one example, the external load data may include a request to have the battery system throttle the voltage and/or amperage. The BMS may, depending on its configuration, act on the request and throttle the voltage and/or amperage.

At any time, the BMS may detect that the external load is disconnected from the battery system. External loads may be detected by the closure of the control circuit via the signal output connector and the signal input connector. Removal of the external load from the external connection port, or the opening of the control circuit by the external load plugged into the external connection port results in the BMS determining that the external load is disconnected. For example, where the external load is a power saw and it detects that it has run into concrete, it can stop operation and open the control circuit to cause the battery system to cut power. In this case, the BMS determines that the external load is disconnected. Upon detecting that the external load is disconnected, the BMS recommences detecting whether an external device is connected at.

While detection of the external charger is done analog in the above embodiment, detection of the external charger can be performed via an external device identifier message sent by the external charger via the data communications interface, or via some other communication that identifies the type of the external device.

In some cases, the BMS may alternatively generate and transmit charge instructions to an external charger as to which of a set of predefined charge stages to operate in. In one embodiment, three charge stages are pre-defined:

bulk charge, in which the external charger operates using the highest voltage and amperage that it is capable of;

absorption charge, in which the external charger charges the battery system at a steady voltage while the amperage declines, thus allowing continued charging of batteries without overheating; and float charge, in which the external charger generates the maximum voltage that the batter system can hold while dropping the amperage down to a trickle.

For example, if a battery SoC is 65% and the temperature of the battery is within a standard operating range, then a BMS of the battery directs the external charger to operate in a bulk charge mode. In some embodiments, the BMS of the battery may be a distributed BMS that has chips on each cell to control balancing and that are managed by a main head board.

In embodiments, the battery system may constantly be on standby and sending out messages as well as listening for a response. The battery system may continuously operate in this manner. While the data communications interfaces described above between the battery system and external devices are bidirectional, two or more unidirectional communication data communications interfaces may be employed to enable the battery system to communicate data to the external device and to receive communications from the external device.

While, in the above-described embodiment, battery operation data is transmitted to the external load via the same external connection port that is used to receive external load data from the external load, the sensor interface for providing sensor data to the external load may be separate from the external connection port. For example, the battery system may have one or more external sensor ports that are separate from the external connection port for transmitting battery operation data to the external load and external charger.

In some embodiments, two or more batteries of a battery system communicate with one another via power lines using a network style adapter. In some embodiments, the main component facilitating the communication through the power lines is a 24V/48V DC battery power line CAN bus communication board that uses a PIC18F45K80 Microcontroller Unit (MCU) by MicroChip and a DCAN500 transceiver integrated circuit (IC) by YAMAR. By integrating the CAN bus communication through the battery power lines the number of components and connectors required in the battery system and the complexity of the battery system for an end user are reduced.

In some embodiments, the battery system includes smart parallel battery integration which requires no battery pre-balancing. With the DCAN500 transceiver IC by YAMAR, the CAN bus communication via the battery power lines may support multiple batteries (e.g., 2, 5, 10, or 25 batteries) working together in parallel, creating a completely scalable and modular battery system. Without the 24V/48V DC battery power line CAN bus communication board, a modular battery system would require the end user to either remove or add termination resistors as CAN bus communication requires two termination resistors (one on each end of the CAN bus lines). However, the YAMAR DCAN500 transceiver IC is capable of receiving a signal and transmitting the signal over battery power lines to another YAMAR DCAN500 transceiver IC which may then communicate the signal to other CAN bus devices. The DCAN500 transceiver IC acts as an intermediary allowing for each CAN bus device to communicate without the end user adding or removing resistors. Other devices are able to connect to the battery system given they have CAN bus communication capabilities.

In embodiments, the BMS of each of the batteries in the battery system autonomously determine which BMS of all the batteries has overarching control (i.e., the master), the remaining BMS of batteries being designated as slaves that follow the orders of the master. In some embodiments, the master is determined based on a BMS serial number, wherein the BMS with lowest serial number is designated the master. In other embodiments, different methods may be used to designate which BMS are the master and the slaves. For example, if the battery with master BMS has a fault it may decide to give up control to another battery. Once the master BMS is selected, the master BMS dictates the behaviour of all the batteries collectively, as if they were one. If one battery misbehaves or an error occurs with the battery, the master BMS may disconnect the battery by disconnecting its contactor. If a battery is in a different SoC in comparison to other batteries of the battery system, the master BMS may prevent the battery from integrating with the other batteries until the other batteries are at the same SoC. In embodiments, the BMS designated as the master controls overall operations of the battery system. The operations may comprise activating and deactivating charging and discharging and operation of each slave battery, obtaining for the each of the batteries battery capacities, state of charge, and discharge and charge limits, and determining if each parallel string of the battery system is active or inactive based on individual voltages of the batteries.

Figure 4:
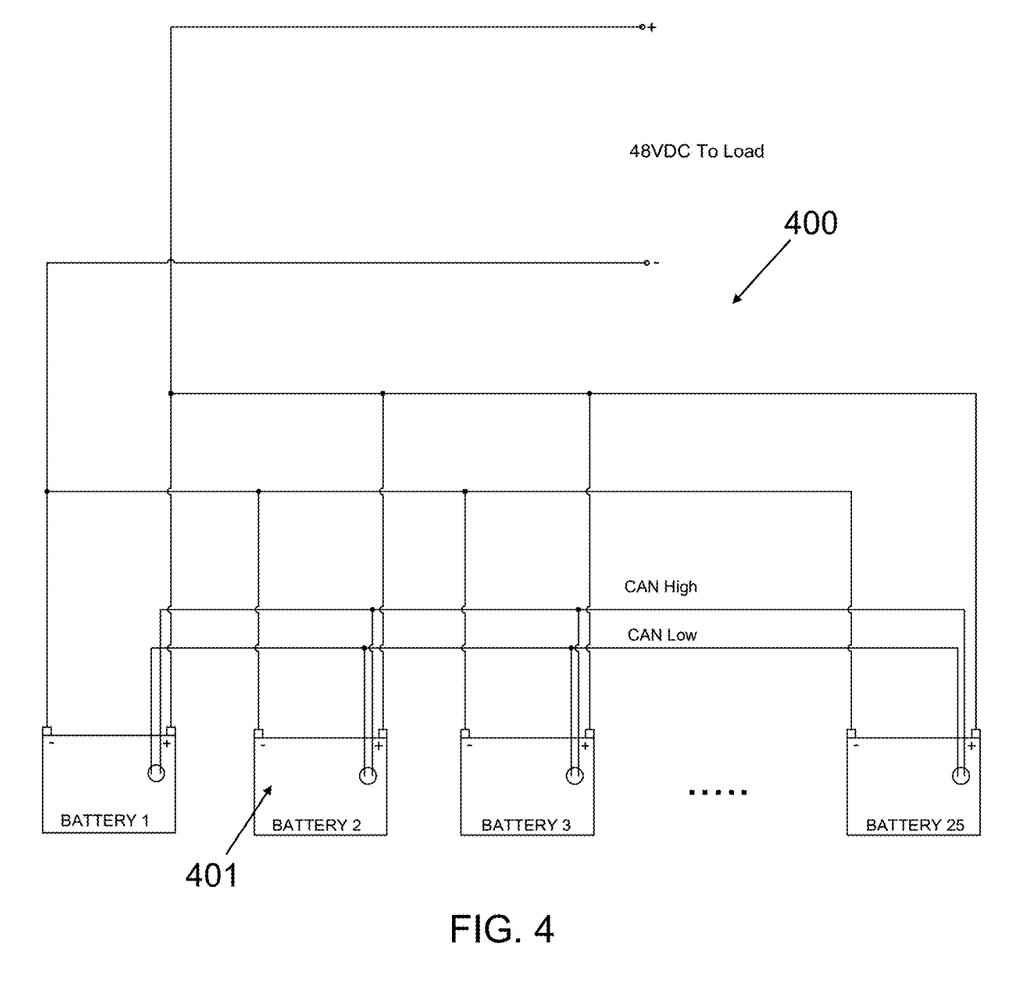
FIG. 4 illustrates an example of a battery system including 25 batteries, according to some embodiments.

FIG. 4 illustrates an example of a battery system 400 including 25 batteries 401 connected to each other in parallel. Each battery includes its own BMS, as described above, with one BMS of all batteries 401 being the master and the remaining the slaves. In some embodiments, each battery includes a structural battery enclosure that allows for easy stacking of batteries. In some embodiments, each battery is completely sealed in a battery enclosure for outdoor use to protect it from varying weather conditions.

In embodiments, the battery system operates as an integrated battery system when separate batteries are connected. The BMS of batteries make intelligent system-level and battery-level decisions, allowing for flexible scenario operations. Given that the batteries are able to communicate with one another, the end user may add and remove batteries at any time without having to worry about whether the batteries are within the correct voltage range. When a new battery is introduced into the battery system, the voltage and battery parameters of the new battery are communicated to at least one BMS of the batteries within the battery system and the master BMS decides whether to integrate the new battery output with the rest of the batteries of the battery system based on the communicated information and sensor data pertaining to the other batteries. If a voltage difference is detected and deemed unsafe to integrate, the master BMS prevents the new battery from integrating until the voltage is deemed safe. Once integrated, the master BMS determines new system-level parameters and outputs them to the display and external components. For example, if a first battery of the battery system is at 100% charge and a second battery at 30% charge is added to the battery system, the master BMS prevents the newly added second battery with 30% charge from connecting in parallel to the first battery with 100% as their connection would dangerously result in a massive current transfer from one battery to the other. Instead, the master BMS waits until the first battery with 100% charge is used up to approximately 30% charge and then permits the second battery with 30% charge to connect with the first battery.

The intelligent parallel battery integration described herein differs from current technologies as they only allow for system-level monitoring via a communication network but do not actively action any items. For example, battery pack SoC may be tabulated and communicated to outside devices, however, no intelligent action is taken at the battery-level. The intelligent parallel battery integration system described herein is capable of taking individual action on a per battery basis based on data compiled at a system-level. In some embodiments, the batteries of the battery system may be connected in different configurations. For example, the batteries may be connected in series to allow for a different setup.

In some embodiments, the battery system further includes an integrated automated heating system for keeping the batteries warm at colder temperatures. In some embodiments, the battery system may further include active cooling for keeping the batteries cool at higher temperatures. In some embodiments, the battery system may be liquid cooled in extreme heat environments. In some embodiments, a BMS may use a machine learning algorithm to learn optimal operation temperature of batteries for different types of external loads (e.g., power tool, electric motors, small hut, etc.) or for different environments (e.g., desert, arctic, damp environments, etc.) based on sensor data collected (e.g. temperature rise of the battery, average temperature in comparison to ambient temperature to observe if insulation is sufficient). In some embodiments, the battery system and/or individual batteries may include Bluetooth, Wi-Fi, and/or cellular data connection capabilities, such that a user may monitor the battery system and/or batteries remotely by having wireless access to battery system data collected by sensors of the system. A user may monitor such data using an application of a communication device paired with the battery system. The application may be configured to display battery system information and receive inputs designating instructions for the battery system. The master battery management system may execute the instructions received from the application of the communication device.

The above-described embodiments are intended to be examples of the present invention and alterations and modifications may be effected thereto, by those of skill in the art, without departing from the scope of the invention that is defined solely by the claims appended hereto.

The invention claimed is:
1. A battery system, comprising:
   at least two batteries, each battery comprising a battery management system;
   a plurality of sensors for sensing battery operation data;
   at least one external connection port;
   wherein:

at least two battery management systems of the at least two batteries are coupled to the at least one external connection port; and at least two battery management systems of the at least two batteries store machine-executable instructions, that when executed, cause the at least one battery management system to communicate battery operation data to at least one external load;

wherein:
one battery management system of the at least two batteries is designated as a master and the remaining battery management systems of the at least two batteries are designated as slaves; and the battery management system designated as the master controls overall operations of the battery system.

2. The battery system of claim 1, wherein the communications are executed over power lines via a CANBUS.

3. The battery system of claim 1, wherein the machine-executable instructions, that when executed, further cause the at least one battery management system to communicate with at least two other battery management systems of the at least two batteries.

4. The battery system of claim 3, wherein the communications are executed over power lines via a CANBUS.

5. The battery system of claim 1, wherein the at least two batteries are connected in parallel.

6. The battery system of claim 1, wherein the operations comprise activating and deactivating charging and discharging of the battery system, operation of each slave battery, and obtaining for the at least two batteries battery capacities, state of charge, and discharge and charge limits.

7. The battery system of claim 1, wherein the operations comprise determining if each parallel string of the battery system is active or inactive based on individual voltages of the at least two batteries.

8. The battery system of claim 1, wherein the operations comprise determining when a new battery is integrated with the battery system based on at least state of charge of the at least two batteries of the battery system.

9. The battery system of claim 1, further comprising a heating element for resistive heating or active control of energy to produce heat.

10. The battery system of claim 1, further comprising a CANBUS controlled display for outputting operational data and battery status.

11. The battery system of claim 1, wherein:
the plurality of sensors comprises at least one of a thermal sensor and a voltage tap; and
at least one of the plurality of sensors detects an amperage draw during discharge and an amperage accepted during charging.

12. The battery system of claim 1, wherein the at least one external load terminates power supplied by the battery system to the at least one external load via the at least one external connection port.

13. A method of operating a battery system, comprising:
determining, by at least one battery management system of a plurality of battery management systems each corresponding to a respective battery of the battery system, a master battery management system of the plurality of battery management systems;
transmitting, by the master battery management system, battery operation data to an external load connected to an external connection port of the battery system over power lines via a CANBUS; and determining, by the master battery management system, when a new battery is integrated with the battery system based on at least state of charge of the batteries of the battery system wherein:
the external connection port is configured to transmit power from the battery system to the external load and power from an external charger to the battery;
all battery management systems except the master battery management system are designated as slaves;
the master battery management system controls overall operations of the battery system; and
the master battery management system communicates with the remaining battery management systems over power lines via CANBUS.

14. The method of claim 13, wherein the batteries of the battery system are connected in parallel or in series.

15. The method of claim 13, wherein the operations comprise activating and deactivating charging and discharging of the battery system, operation of each slave battery, obtaining for the batteries of the battery system battery capacities, state of charge, and discharge and charge limits, and determining if each parallel string of the battery system is active or inactive based on individual voltages of the batteries of the battery system.

16. The method of claim 13, further comprising:
terminating, by the external load, power supplied by the battery system to the external load via the external connection port.

17. The method of claim 13, further comprising:
receiving, by the master battery management system, external load data from the external load comprising at least a request; and
modifying, by the master battery management system, how power is provided to the external load based on at least the request.

18. The method of claim 13, further comprising:
determining, by the master battery management system, an optimal temperature of the battery system based on the external load and environmental conditions using a machine learning algorithm;
transmitting, by the master battery management system, data to an application of a communication device paired with the battery system, wherein the application is configured to display battery system information and receive inputs designating instructions for the battery system; and
executing, by the master battery management system, the instructions received from the application of the communication device.

19. The method of claim 13, wherein at least one of:
the master battery management system conditions the battery system between a charging mode when the external connection port is connected to an external charger and a discharging mode when the external charger is undetected via the external connection port;
the master battery management system conditions the battery system between the discharging mode and the charging mode when a charger detection connector of the external connection port is connected to a ground contact of the external charger; and
the external connection port comprises a data communications interface and the master battery management system conditions the battery system to a charging mode when the external charger communicated an external device identifier message to the battery system via the external connection port.

\* \* \* \* \*